(12) United States Patent
Dardona et al.

(10) Patent No.: US 10,440,829 B2
(45) Date of Patent: Oct. 8, 2019

(54) HEATING CIRCUIT ASSEMBLY AND METHOD OF MANUFACTURE

(71) Applicants: United Technologies Corporation, Hartford, CT (US); Goodrich Corporation, Uniontown, OH (US)

(72) Inventors: Sameh Dardona, South Windsor, CT (US); Michael P. Humbert, Manchester, CT (US); John P. Wesson, West Hartford, CT (US); Wayde R. Schmidt, Pomfret Center, CT (US); Daniel V. Viens, Mansfield Center, CT (US); Jin Hu, Hudson, OH (US)

(73) Assignee: United Technologies Corporation, Farmington, CT (US)

( * ) Notice: Subject to any disclaimer, the term of this patent is extended or adjusted under 35 U.S.C. 154(b) by 258 days.

(21) Appl. No.: 14/790,886

(22) Filed: Jul. 2, 2015

(65) Prior Publication Data

US 2016/0007474 A1 Jan. 7, 2016

Related U.S. Application Data

(60) Provisional application No. 62/020,707, filed on Jul. 3, 2014.

(51) Int. Cl.
*H05K 3/00* (2006.01)
*H05B 3/12* (2006.01)
(Continued)

(52) U.S. Cl.
CPC ......... *H05K 3/0014* (2013.01); *H05B 3/0014* (2013.01); *H05B 3/06* (2013.01);
(Continued)

(58) Field of Classification Search
CPC ... H05B 3/84; H05B 3/20; H05B 3/56; H05B 3/86; H05B 3/54; H05B 3/0014;
(Continued)

(56) References Cited

U.S. PATENT DOCUMENTS 3,548,149 A    12/1970  Rizzolo et al.
3,772,075 A *  11/1973  Tarnopol ............. C03C 17/3642
                                                      106/1.11

(Continued)

FOREIGN PATENT DOCUMENTS

EP    1253289    10/2002
EP    1605729    12/2005
(Continued)

OTHER PUBLICATIONS

EP Search Report dated Nov. 19, 2015.
Extended EP Search Report for EP Appln. No. 17206270.5 dated Apr. 26, 2018.

*Primary Examiner* — Shawntina T Fuqua
(74) *Attorney, Agent, or Firm* — O'Shea Getz P.C.

(57) ABSTRACT

A heating circuit assembly and method of manufacture includes an electrically conductive heating element having a pattern. An electrically non-conductive substrate is additive manufactured and secured to the element for structural support. The substrate has a topology that generally aligns with the pattern of the element thereby reducing the assembly weight and minimizing substrate material waste.

19 Claims, 3 Drawing Sheets

(51) Int. Cl.
        *H05B 3/14*      (2006.01)
        *H05B 3/26*      (2006.01)
        *H05B 3/34*      (2006.01)
        *H05B 3/84*      (2006.01)
        *H05B 3/00*      (2006.01)
        *H05B 3/06*      (2006.01)
        *H05B 3/16*      (2006.01)
        *H05K 3/12*      (2006.01)
        *H05K 3/30*      (2006.01)
        *B33Y 80/00*     (2015.01)

(52) U.S. Cl.
        CPC ............... *H05B 3/12* (2013.01); *H05B 3/145* (2013.01); *H05B 3/16* (2013.01); *H05B 3/265* (2013.01); *H05B 3/267* (2013.01); *H05B 3/34* (2013.01); *H05B 3/84* (2013.01); *H05K 3/12* (2013.01); *H05K 3/30* (2013.01); *B33Y 80/00* (2014.12); *H05B 2203/003* (2013.01); *H05B 2203/013* (2013.01); *H05B 2203/017* (2013.01); *H05B 2214/02* (2013.01); *H05B 2214/04* (2013.01)

(58) Field of Classification Search
        CPC . H05B 3/026; H05B 3/06; H05B 3/12; H05B 3/145; H05B 3/16; H05B 3/265; H05B 3/267; H05B 3/34; H05B 2203/007; H05B 2203/011; H05B 2203/013; H05B 2203/033; H05B 2203/037; H05B 2203/008; H05B 2203/031; H05B 2203/003; H05B 2203/017; H05B 2214/02; H05B 2214/04; H05K 3/30; H05K 3/0014; H05K 3/12; B33Y 80/00
        See application file for complete search history.

(56) References Cited

U.S. PATENT DOCUMENTS

| | | | |
|---|---|---|---|
| 4,531,036 A | 7/1985 | Lewis | |
| 4,541,898 A | 9/1985 | Mase et al. | |
| 4,611,744 A | 9/1986 | Fraser et al. | |
| 4,657,171 A | 4/1987 | Robins | |
| 4,855,011 A | 8/1989 | Legge et al. | |
| 4,883,940 A * | 11/1989 | Tokarz | B32B 27/30 219/203 |
| 5,185,513 A | 2/1993 | Pacileo | |
| 5,205,465 A | 4/1993 | Bogard et al. | |
| 5,462,838 A | 10/1995 | Sato et al. | |
| 5,549,768 A | 8/1996 | Mahoney | |
| 5,762,727 A | 6/1998 | Crawmer et al. | |
| 6,037,571 A | 3/2000 | Christopher | |
| 6,117,564 A | 9/2000 | Crawmer et al. | |
| 6,536,110 B2 | 3/2003 | Smith et al. | |
| 6,693,173 B2 | 2/2004 | Mamidi et al. | |
| 6,787,740 B2 | 9/2004 | Smith et al. | |
| 6,902,096 B2 | 6/2005 | Robertson et al. | |
| 7,146,725 B2 | 12/2006 | Kottilingam et al. | |
| 8,058,591 B2 | 11/2011 | Demichael | |
| 2002/0195176 A1 | 12/2002 | Smith et al. | |
| 2005/0109767 A1* | 5/2005 | Fennewald | B29C 45/2737 219/543 |
| 2009/0001066 A1 | 1/2009 | Pilavdzic et al. | |
| 2009/0272728 A1* | 11/2009 | Abbott | F24C 7/04 219/399 |
| 2010/0024185 A1 | 2/2010 | Mayabb | |
| 2013/0146227 A1 | 6/2013 | Mileti et al. | |
| 2015/0189699 A1 | 7/2015 | Ploshikhin et al. | |

FOREIGN PATENT DOCUMENTS

| | | |
|---|---|---|
| GB | 1108124 | 4/1968 |
| JP | 54084308 | 6/1979 |
| JP | 55008462 | 1/1980 |
| JP | 56163091 | 12/1981 |
| WO | 2014073545 | 5/2014 |

* cited by examiner

HEATING CIRCUIT ASSEMBLY AND METHOD OF MANUFACTURE

This application claims priority to U.S. Patent Appln. No. 62/020,707 filed Jul. 3, 2014.

BACKGROUND

The present disclosure relates to a heating circuit assembly, and more particularly, to an additive manufactured heating circuit assembly and method of manufacture.

Heating circuits are used in many products in the automotive and aviation industries as two, non-limiting, examples. Such products may include defrosting of windshields, comfort applications such as heating of automotive steering wheels, armrests, seats, side panels and floors, and de-icing and anti-icing applications such as aircraft wings and nacelles. Known heating circuits are typically made by photochemically etching metallic alloy foils on a substrate and subsequently built into electro thermal heater composites. Unfortunately, this method of manufacture may suffer from insufficient repeatability due to over or under-etching, photoresist alignment issues, delamination of the photoresists, poor adhesion to the substrate and other issues. Also, the process is time and labor intensive, and can result in a significant amount of chemical waste. Yet further, application of the heating circuit assembly to a three-dimensional component is limited, and the need for structurally competent designs consistent with weight restrictions continues to present challenges in the industry.

SUMMARY

A heating circuit assembly according to one, non-limiting, embodiment includes an electrically conductive element arranged in a pattern; and an electrically non-conductive substrate secured to the element and having a topology that generally aligns with the pattern.

Additionally to the foregoing embodiment, the substrate is thermoplastic.

In the alternative or additionally thereto, in the foregoing embodiment, the substrate is a thermosetting substrate.

In the alternative or additionally thereto, in the foregoing embodiment, the pattern and topology are three-dimensional.

In the alternative or additionally thereto, in the foregoing embodiment, the substrate includes at least one of a glass and a ceramic material to enhance structural integrity.

In the alternative or additionally thereto, in the foregoing embodiment the assembly includes an electrically non-conductive and thermally conductive layer secured to at least the element with the element disposed between the substrate and layer.

In the alternative or additionally thereto, in the foregoing embodiment, the layer is an additive manufactured layer.

In the alternative or additionally thereto, in the foregoing embodiment, the layer has a topology that corresponds to the pattern.

In the alternative or additionally thereto, in the foregoing embodiment, the layer includes at least one of glass and ceramic materials to enhance structural integrity.

In the alternative or additionally thereto, in the foregoing embodiment, the layer includes at least one of boron nitride, aluminum oxide, aluminum nitride, silicon carbide, and diamond particles to control thermal conductivity.

In the alternative or additionally thereto, in the foregoing embodiment, the heating circuit is shaped to establish a conforming fit against a component to be heated.

In the alternative or additionally thereto, in the foregoing embodiment, the assembly is a de-icing assembly.

In the alternative or additionally thereto, in the foregoing embodiment, the element is an alloy and printed upon the substrate.

In the alternative or additionally thereto, in the foregoing embodiment, the substrate is thermally non-conductive.

In the alternative or additionally thereto, in the foregoing embodiment, the substrate is thermally reflective.

A method of manufacturing a heating circuit assembly according to another, non-limiting, embodiment includes additive manufacturing an electrically non-conductive substrate; and printing an electrically conductive element on the substrate.

Additionally to the foregoing embodiment, the substrate is non-planar and is shaped to establish a conforming fit to a component to be heated.

In the alternative or additionally thereto, in the foregoing embodiment, the substrate is formed through a fused deposition modeling technique.

In the alternative or additionally thereto, in the foregoing embodiment the method includes the step of additive manufacturing a thermally conductive layer over the substrate and the element.

In the alternative or additionally thereto, in the foregoing embodiment the method includes the step of curing the printed element before additive manufacturing the layer.

The foregoing features and elements may be combined in various combinations without exclusivity, unless expressly indicated otherwise. These features and elements as well as the operation thereof will become more apparent in-light of the following description and the accompanying drawings. It should be understood; however, that the following description and figures are intended to be exemplary in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows.

DETAILED DESCRIPTION

Figure 1:
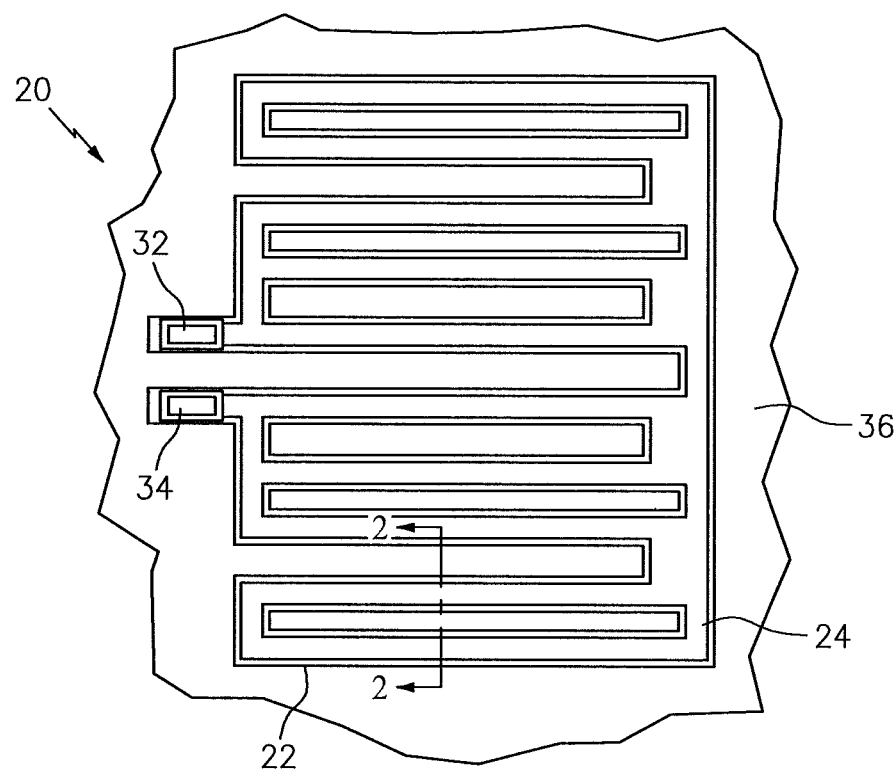
FIG. 1 is a plan view of a heating circuit assembly according to an exemplary embodiment of the present disclosure.
Figure 2:
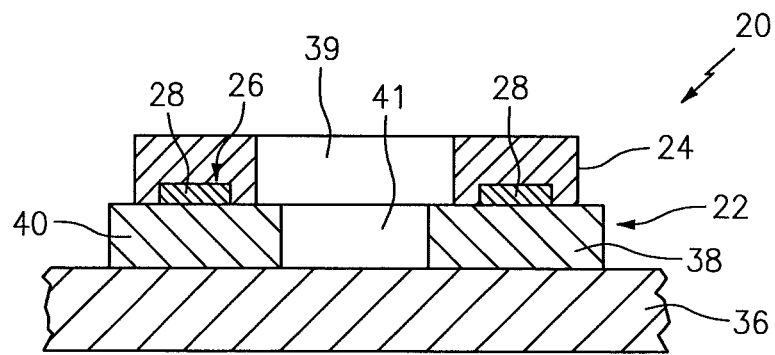
FIG. 2 is a cross section of the heating circuit assembly taken along line 2-2 of FIG. 1.
Figure 3:
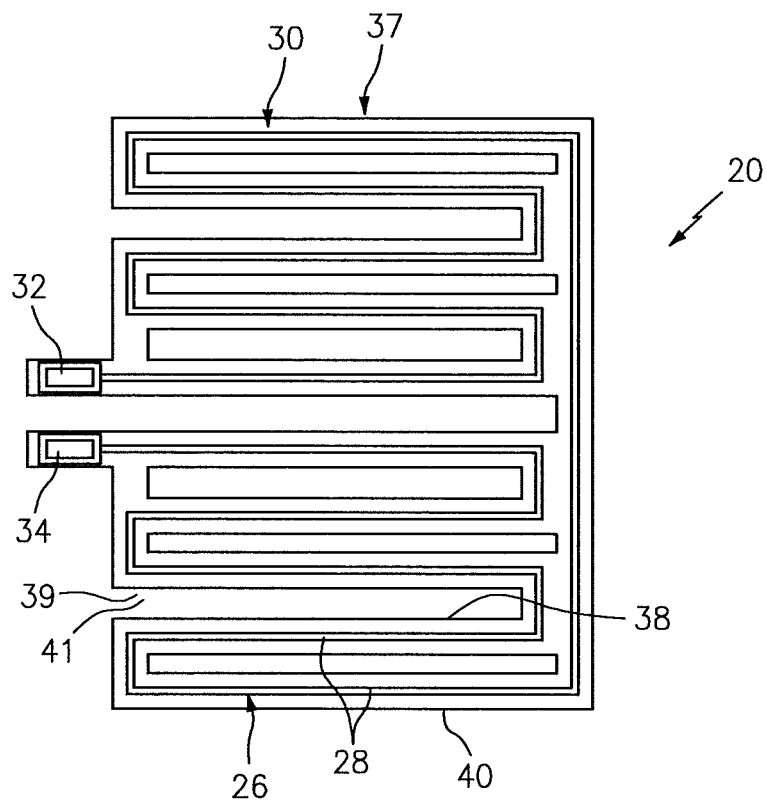
FIG. 3 is a plan view of the heating circuit assembly with a layer removed to show internal detail.

FIGS. 1 through 3 illustrate a heating circuit assembly 20 having a substrate 22, a protective layer 24 and an electrically conductive heating element 26 located between the substrate 22 and layer 24. The heating element 26 may have a plurality of tracks 28 arranged in an interconnected maze-like pattern 30 (see FIG. 3) to accomplish a desired heating function. The element further has supply and return leads 32, 34 (i.e. electrically positive and negative) connected to an electrical power source (not shown). The element 26 is generally printed onto the substrate 22 and may be solid, perforated and/or gridded. If the element 26 is perforated and/or gridded, the size, shape, and spacing of the perforations or grids can be varied to achieve the desired resistance, including making sure that the leads 32, 34 are less resistant than the tracks 28.

The heating element 26 may be printed (and/or additive manufactured) onto the substrate 22 in a mask-free manner and utilizing an ink solution that includes a post-print curing time allowing the ink to dry, if required. The ink solution may be a particle-free solution with a metal compound that is dissolved in a solvent. For example, the ink solution may be made with an organo-metallic platinum ink mixed with a solvent such as toluene, cyclopentanone, cyclohexanol and others, and a viscosity modifier such as nisole or terpineol. Another example of a particle-free ink solution is a silver ink that may have a solution of silver acetate and ammonia, or an organo-silver compound in an aromatic hydrocarbon solvent, with the silver remaining dissolved in the solution(s) until it is printed and the liquid evaporates. Furthermore, the element 26 may be an alloy printed upon the substrate 22.

The ink may alternatively include metal particles such as nanoparticles. Examples of nanoparticle dispersions may include aqueous silver inks that include nanosilver particles having a size range of about 20 nm to 400 nm. Such inks may become highly conductive as they dry and additional thermal or light-pulse curing can further increase conductivity. Another example of a nanoparticle ink may be an aqueous copper ink that includes copper nanoparticles having a particle size of about 140 nm. Other nanoparticle inks may include nanoparticles of gold or other electrically conductive materials or mixtures of nanoparticles.

Ink solutions that do not contain metal and/or do not require post-print curing are also feasible and contemplated. For example, carbon nanotubes, surface modified to be dispersible as stable suspensions, can be employed as the ink solution. Such ink solutions would form carbon-based conductive paths in the element 26.

Curing of the printed ink may be based on the substrate 22 material. Substrate materials with relatively low temperature stability may require the electrical element 26 to be cured with ultraviolet (UV) irradiation, while a thermal curing step may be employed for higher temperature thermoplastic substrates. It is further contemplated and understood that the element 26 may be applied via thermally sprayed methods (e.g. meso-plasma) that do not require curing and thus can be used on low melting temperature substrates such as ABS, as one example. Furthermore, the heating element 26 may be applied via printing using powder spray direct write methods such as micro-cold spray and thermal spray. Mircro-cold spray uses high kinetic energy from pressurized gas to deposit small particles (i.e. about one to five microns) onto a substrate. Micro-cold spray can deposit traces less than about fifty microns in width. Thermal spray (e.g. meso-plasma) applies a stream of powder (i.e. micro particles) injected into a high temperature chamber or miniaturized plasma. The particles will soften as they come out of the chamber and are used to create a strongly adhered coating on the substrate. Powder spray methods may use metals such as copper (Cu), silver (Ag) and others, or powder metal alloys such as copper chromium (CuCr), Nickel Chromium (NiCr) and others. The powder metal alloy has many advantages in heating applications including high oxidation and corrosion resistance and low change in resistance at high temperatures.

The additive manufactured substrate 22 may be thermally and electrically non-conductive. Alternatively or further thereto, the substrate 22 may be thermally reflective to direct the heat from the element 26 in the desired direction. The substrate 22 and thus the element 26 may be three-dimensional in the sense that the substrate 22 may be additive manufactured in a three-dimensional shape that generally conforms to the three-dimensional shape of a component 36 to be heated. Non-limiting examples of such a component include those in the aviation industry such as an aircraft wing or nacelle in need of anti-icing or de-icing functions. Further examples of components include windshields, and automotive components such as steering wheels, shift knobs, arm rests, seats, floor panels and others for occupant comfort and/or safety.

The substrate 22 may be flexible, or rigid, and conforming (or profiling) to any variety of complex shapes of the component 36 to be heated (i.e. topology optimized). The substrate 22 may further be made of a thermoplastic material such as polycarbonate or nylon, as two examples, or may be made of a thermosetting material such as vinylester epoxy or rubber. Thermoplastics may be less tolerant of heat but can be formed or remolded by reapplying heat. Thermoset resins, on the other hand, may only be heated and molded once (i.e. additive manufactured). Thermoplastic substrates may be formed through Fused Deposition Modeling (FDM) techniques as one example of additive manufacturing. During manufacturing, material additives possibly in the form of powders may be added to the substrate composition to enhance structural properties (e.g. mitigate residual stresses and distortion). Such additives may include glass and ceramic powders. Other additives to generally control electrical and thermal conductivity may include boron nitride, aluminum oxide, aluminum nitride, diamond particles and others. Such additives may be pre-mixed in powder form with the additive manufacturing raw material or may be sprayed onto the substrate.

The substrate 22 may further have a topology 37 (i.e. three-dimensional pattern) that generally and substantially aligns with the pattern 30 of the element 26. More specifically and as one example, a first track 28 of the element 26 may be laterally spaced from the next adjacent track, thereby providing the boundaries of a gap 39 there-between (see FIGS. 2 and 3). Similarly, a first portion 38 of the substrate 22 that is generally secured to and supports the first track is spaced from a second portion 40 of the substrate that is generally secured to and supports the adjacent track. The boundaries of a gap 41 is thereby defined by the first and second portions 38, 40. In this way, the substrate is only used where required thus minimizing weight and reducing substrate material consumption during the additive manufacturing process.

The protective layer 24 of the assembly 20 may be additive manufactured over and to the substrate 22 and the element 26 after the element has cured. The layer 24 may be optimized for weight reduction, similar to the substrate 22, while still providing structural integrity. The layer 24 material may be thermally conductive and electrically insulating. Additives to the layer material for controlling thermal conductivity may include boron nitride, aluminum oxide, aluminum nitride, diamond particles, and others. Additives to the layer material for enhancing structural integrity may include glass and ceramic powders, amongst others. For de-icing applications of the heating circuit assembly 20, a coating may be added to the layer 24 that induces a high contact angle. Such coating examples may include hydrophobic and superhydrophobic coatings.

Figure 4:
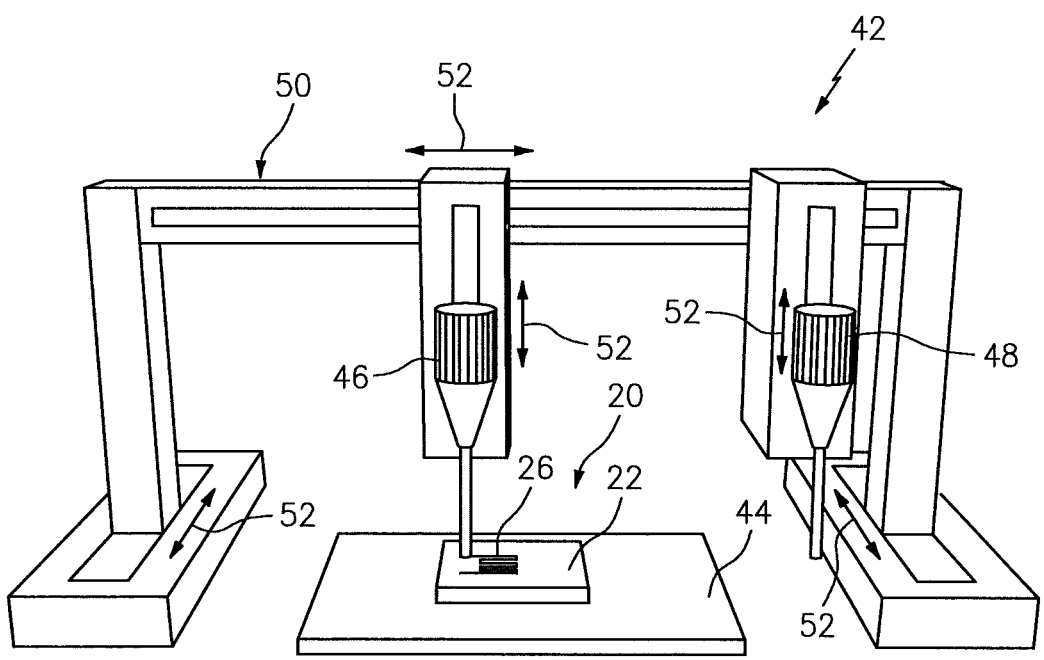
FIG. 4 is a schematic of an additive manufacturing system used to manufacture the heating circuit assembly.

Referring to FIG. 4, an additive manufacturing system 42 for manufacturing, at least in-part, the heating circuit assembly 20 is illustrated. The system 42 may have a build table 44 for supporting the assembly 20, a circuit printing head 46 and a substrate printing head 48. Both heads 46, 48 may be secured to a three-dimensional positioning device 50 (see arrows 52 for movement direction) for shaping the three-dimensional assembly 20. Although not illustrated, the circuit printing head 46 may be fed an on-demand supply of ink. The substrate printing head 48 may manufacture both the substrate 22 and the layer 24 in a layer-by-layer fashion or just the substrate 22 with another head (not shown) dedicated to manufacture the layer.

The substrate printing head 48 may include an energy gun (not shown) for melting and/or sintering a raw substrate material that may be in powder form to a previously formed layer or slice of the substrate 22. The powder, itself, may be fed directly through the head 48 or may otherwise be supported by the build table 44 where it may generally be spread over the workpiece and leveled by a spreader device (not shown) for each successive layer production of the substrate. The additive manufacturing process may generally be controlled electronically by a controller (not shown) and a computer system configured to electronically partition an electronic file (e.g. an integral computer aided design (CAD) system for modeling at least a portion of the assembly 20 into a plurality of slices to be additive built atop one-another). Although the positioning device 50 is illustrated as having the ability to vertically move the heads 46, 48, alternatively, the build table 44 may be constructed to move the workpiece or assembly 20 vertically. It is further contemplated that a single head may be used to perform both the substrate manufacturing and the element 26 manufacturing if a means to change the raw material supply is provided. Similarly, the substrate printing head 48 may also be used to manufacture the layer 24.

The controller controls the various components and operations through electric and/or digital signals that may be hard-wired, or wirelessly coupled, between one or more of the system components. The controller may be implemented with a combination of hardware and software. The hardware may include memory and one or more single-core and/or multi-core processors. The memory may be a non-transitory computer readable medium, and adapted to store the software (e.g. program instructions) for execution by the processors. The hardware may also include analog and/or digital circuitry other than the described above.

Each solidified slice of the assembly 20 may be associated with and produced from a respective layer of the powder bed prior to solidification. The powder layer may be placed on top of (or spread over) a build surface that may be carried by the previously solidified slice, or during initial operation, the build table 44. The controller generally operates the system 48 through the series of electrical and/or digital signals sent to the system components.

Examples of additive manufacturing techniques and particularly those for manufacturing the substrate 22 and/or layer 24 include Additive Layer Manufacturing (ALM) devices, such as Direct Metal Laser Sintering (DMLS), Selective Laser Melting (SLM), Laser Beam Melting (LBM), Fused Deposition Modeling (FDM) and Electron Beam Melting (EBM) that provide for the fabrication of complex metal, alloy, polymer, ceramic and composite structures by the freeform construction of the workpiece, layer-by-layer. The principle behind additive manufacturing processes involves the selective melting of powder beds by the directed energy gun, producing the lithographic build-up of the workpiece (i.e. heating circuit assembly 20). The melting of the powder occurs in a small localized region of the energy beam, producing small volumes of melting, called melt pools, followed by rapid solidification, allowing for very precise control of the solidification process in the layer-by-layer fabrication of the workpiece. These devices are directed by three-dimensional geometry solid models developed in computer software systems such as, for example, Computer Aided Design (CAD) software systems.

The EBM system utilizes an electron beam gun and the DMLS, SLM, and LBM systems utilize a laser as the energy source. Both system beam types are focused by one or more lenses, then deflected by an electromagnetic scanner or rotating mirror so that the energy beam selectively impinges on a powder bed, free-fall laid deposits of the powder, wire fed raw material, and other raw material feeding means known in the art of additive manufacturing.

The EBM system uses a beam of electrons accelerated by an electric potential difference and focused using electromagnetic lenses that selectively scans the powder bed. The DMLS, SLM and LBM utilize a focused laser beam scanned by a rotating mirror (not shown). The EBM technology offers higher power densities, and therefore faster scanning rates, over lasers. The powder (as one example) is melted at the energy focus site on the build surface or substrate. The strategy of the scanning, power of the energy beam, residence time or speed, sequence of melting may be directed by the embedded CAD system. If a powder bed technique is applied, the precursor powder is either gravitationally fed from cassettes or loaded by a piston so that it can be raked onto the build table. The excess powder is raked off and collected for re-application.

It is contemplated and understood that the powder may not have an actual powder consistency (i.e. physical form), but may take the faun of any raw material capable of being fused, sintered or melted upon a build surface of a workpiece and in accordance with additive manufacturing techniques. It is further understood and contemplated that the additive manufacturing system may include a method where fusing of powder is done by high-speed accumulation and then energy beam sintered.

Figure 5:
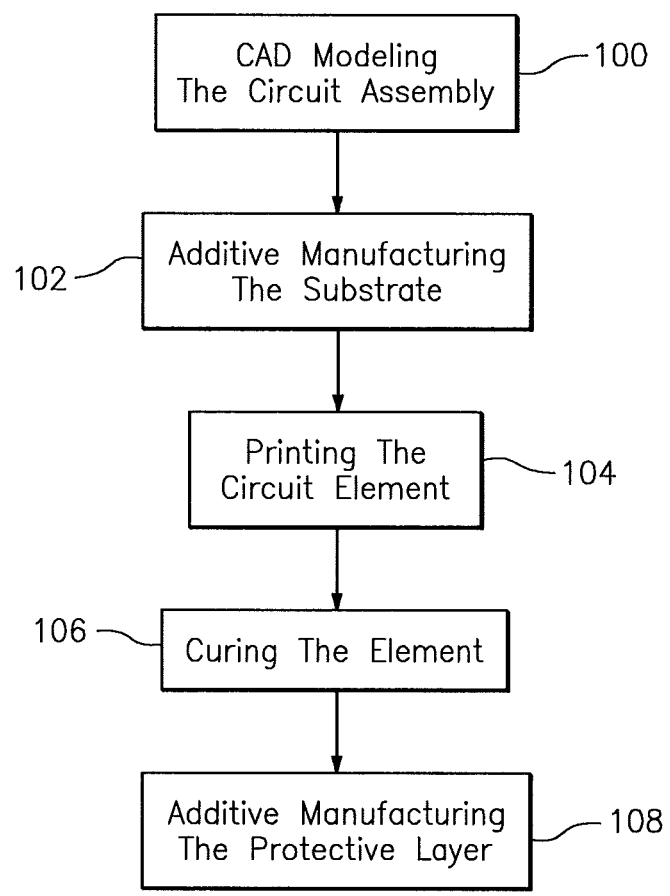
FIG. 5 is a flow chart illustrating a method of manufacturing the heating circuit assembly.

Referring to FIG. 5, a method of additive manufacturing the heating circuit assembly 20 is illustrated. At block 100, a three-dimensional shape of the heating circuit assembly 20 is electronically modeled (e.g., CAD model) such that it conforms to and fits against the component 36 to be heated. At block 102 the substrate 22 is additive manufactured using the substrate printing head 48 or the additive manufacturing system 42. At block 104, the circuit element 26 is printed onto the substrate 22 using the circuit printing head 46 of the additive manufacturing system 42. At block 106 a curing process is undertaken that allows the deposited ink of the element 26 to cure or dry. At block 108, once curing has occurred, the substrate printing head 48 is utilized to additive manufacture the protective layer 24 over the element 26 and at least a portion of the substrate 22. While the method steps of FIG. 5 are shown described herein in a particular sequence, it will be appreciated that some steps may be omitted or varied, that other and/or additional steps may be utilized, and that the ordering of such steps may vary.

It is also understood that like reference numerals identify corresponding or similar elements throughout the several drawings. It should be understood that although a particular component arrangement is disclosed in the illustrated embodiment, other arrangements will also benefit. Although particular step sequences may be shown, described, and claimed, it is understood that steps may be performed in any order, separated or combined unless otherwise indicated and will still benefit from the present disclosure.

The foregoing description is exemplary rather than defined by the limitations described. Various non-limiting embodiments are disclosed; however, one of ordinary skill in the art would recognize that various modifications and variations in light of the above teachings will fall within the scope of the appended claims. It is therefore understood that within the scope of the appended claims, the disclosure may be practiced other than as specifically described. For this reason, the appended claims should be studied to determine true scope and content.

What is claimed is:

1. A heating circuit assembly comprising:
   an electrically conductive element arranged in a pattern and including a first track and an adjacent second track laterally spaced from the first track by a first gap; and
   an electrically non-conductive substrate secured to the element and having a topology that generally aligns with the pattern; and
   an electrically non-conductive and thermally conductive layer secured to at least the element with the element disposed between the substrate and layer;
   wherein the substrate includes a first portion and a second portion separated from the first portion by a second gap, the first portion supports the first track, and the second portion supports the second track.

2. The heating circuit assembly set forth in claim 1, wherein the substrate is thermoplastic.

3. The heating circuit assembly set forth in claim 1, wherein the substrate is a thermosetting substrate.

4. The heating circuit assembly set forth in claim 1, wherein the pattern and topology are three-dimensional.

5. The heating circuit assembly set forth in claim 4, wherein the substrate includes at least one of a glass and a ceramic material to enhance structural integrity.

6. The heating circuit assembly set forth in claim 1, wherein the layer is an additive manufactured layer.

7. The heating circuit assembly set forth in claim 6, wherein the layer has a topology that generally corresponds to the pattern.

8. The heating circuit assembly set forth in claim 7, wherein the layer includes at least one of glass and ceramic materials to enhance structural integrity.

9. The heating circuit assembly set forth in claim 7, wherein the layer includes at least one of boron nitride, aluminum oxide, aluminum nitride, silicon carbide, and diamond particles to control thermal conductivity.

10. The heating circuit assembly set forth in claim 7, wherein the heating circuit is shaped to establish a conforming fit against a component to be heated.

11. The heating circuit assembly set forth in claim 1, wherein the assembly is a de-icing assembly.

12. The heating circuit assembly set forth in claim 1, wherein the element is an alloy and printed upon the substrate.

13. The heating circuit assembly set forth in claim 1, wherein the substrate is thermally non-conductive.

14. The heating circuit assembly set forth in claim 1, wherein the substrate is thermally reflective.

15. A method of manufacturing a heating circuit assembly comprising:
    additive manufacturing an electrically non-conductive substrate; and
    printing an electrically conductive element on the substrate;
    wherein the substrate is formed through a fused deposition modeling technique.

16. The method set forth in claim 15, wherein the substrate is non-planar and is shaped to establish a conforming fit to a component to be heated.

17. A method of manufacturing a heating circuit assembly comprising:
    additive manufacturing an electrically non-conductive substrate;
    printing an electrically conductive element on the substrate; and
    additive manufacturing a thermally conductive layer over the substrate and the element.

18. The method set forth in claim 17 comprising the further step of:
    curing the printed element before additive manufacturing the layer.

19. The heating circuit assembly of claim 1, wherein a width of the first gap is greater than a width of the second gap.

* * * * *